(12) United States Patent
Harvey

(10) Patent No.: US 7,499,963 B2
(45) Date of Patent: Mar. 3, 2009

(54) COMPLEX FILTER WITH HIGHER ORDER POLE

(75) Inventor: Jackson Harvey, Maple Grove, MN (US)

(73) Assignee: DSP Group Inc., Santa Clara, CA (US)

( * ) Notice: Subject to any disclaimer, the term of this patent is extended or adjusted under 35 U.S.C. 154(b) by 798 days.

(21) Appl. No.: 11/009,367

(22) Filed: Dec. 10, 2004

(65) Prior Publication Data

US 2005/0149592 A1    Jul. 7, 2005

Related U.S. Application Data

(60) Provisional application No. 60/529,027, filed on Dec. 12, 2003.

(51) Int. Cl.
*G06G 7/02* (2006.01)
(52) U.S. Cl. .................................... 708/819
(58) Field of Classification Search ............. 708/819
See application file for complete search history.

(56) References Cited

U.S. PATENT DOCUMENTS

| | | | | |
|---|---|---|---|---|
| 6,212,540 | B1 * | 4/2001 | Murakami et al. | 708/819 |
| 6,266,689 | B1 * | 7/2001 | Shier et al. | 708/819 |
| 6,976,051 | B1 * | 12/2005 | Erdogan et al. | 708/819 |
| 7,092,476 | B1 * | 8/2006 | Melanson | 375/376 |

FOREIGN PATENT DOCUMENTS

WO    0883244 A1    12/1998

OTHER PUBLICATIONS

Stephen Jantzi, Kenneth Martin, and Adel Sedra, "Quadrature Bandpass SD Modulation for Digital Radio," *IEEE JSSC*, vol. 32, No. 12, Dec. 1997, pp. 1935-1950. (Complex Filters, Receiver Architectures).

B.J. Minnis, P.A. Moore, A.W. Payne, A.J. Davie, and N.P.J. Greer, "A Low-IF, Polyphase Receiver for DECT," ISCAS 2000,IEEE International Symposium on Circuits and Systems, May 28-31, 2000, pp. I-60-I-63 (Philips DECT Receiver).

Behzad Razavi, *RF Microelectronics*, Prentice Hall PTR, 1998 (7 pages), (Receiver Architectures, Image Rejection).

Thomas Lee, *The Design of Radio Frequency Integrated Circuits*, Cambridge University Press, 1998, pp. 550-570, (Receiver Architectures, Image Rejection).

Jan Crols and Michiel Steyaert, "An Analog Integrated Polyphase Filter for a High Performance Low-IF Receiver," 1995 Symposium on VLSI Circuits, pp. 87-88 (Active Complex Filters).

(Continued)

*Primary Examiner*—Tan V Mai
(74) *Attorney, Agent, or Firm*—Shumaker & Sieffert

(57) ABSTRACT

Pairs of second-order filters with feedback and cross coupling may be used to implement pairs of complex poles. The cross coupling may be frequency-dependent cross coupling or frequency-independent cross coupling. Frequency independent cross coupling may include coupling an internal node of a biquad filter. The pairs of second-order filters can be used together to form a complex filter. The complex filter can be used to readily provide higher order poles. The resulting complex filter can achieve higher order poles while offering reduced circuit complexity.

26 Claims, 9 Drawing Sheets

OTHER PUBLICATIONS

Qingli Liu, W. Martin Snelgrove, and Adel Sedra, "Switched-Capacitor Implementation of Complex Filters," *ISCAS 1986*, pp. 1121-1124. (Discrete-Time Complex Filters).

Adel Sedra, W. Martin Snelgrove, and Ray Allen, "Complex Analog Bandpass Filters Designed by Linearly Shifting Real Low-Pass Prototypes," ISCAS 1985, pp. 1223-1226 (Active Complex Filters).

Sherif Galal, Mohamed Tawfik, and H.F. Ragaie, "On the Design and Sensitivity of RC Sequence Asymmetric Polyphase Networks in RF Integrated Transceivers," ISCAS 1999, pp. II-593-II-597 (Passive Polyphase Filters).

Asad Abidi, "Direct-Conversion Radio Transceivers for Digital Communications", IEEE Journal of Solid-State Circuits, vol. 30, No. 12, Dec. 1995, pp. 1399-1410, (Zero-IF Architecture, Passive Polyphase Filters).

Jan Crols and Michiel Steyaert, "A Single-Chip 900 MHz CMOS Receiver Front-End with a High Performance Low-IF Topology," IEEE JSSC, vol. 30, No. 12, Dec. 1995, pp. 1483-1492 (Passive Polyphase Filters, Receiver Architectures).

Philsar PH2401 Bluetooth Radio Data Sheet, 2 pages, (date unknown), (Low-IF Architecture Example).

Lucent W7020 Bluetooth Radio Module Data Sheet, 2 pages, Dec. 1999, (Hartley Architecture Example).

Coppejans et al., "Continuous time quadrature band-pass Delta;Sigma modulator with input mixers—RF Circuits and Systems for Wireless Communications", Iee Proceedings: Circuits Devices Systems, vol. 149, No. 5-6, Dec. 1, 2002, (pp. 331-336).

Tsuduki K. et al., "A Realization of a Real Filter Based on a Complex Filter", Electronics and Communications in Japan, Part 3, vol. 80, No. 8, 1997, (pp. 87-94).

Stoyanov G.K. et al., "High Tuning Accuracy Design of Variable IIR Digital Filters", TELSIKS, Oct. 1-3, 2003, (pp. 291-300).

Stoyanov G.K. et al., "New First-And Second-Order Very Low Sensitivity Bandpass/Bandstop Complex Digital Filter Sections", IEEE TENCON, Dec. 2, 1997, (pp. 61-64).

Wai-Kai Chen, "Passive and Active Filters", John Wiley & Sons, Apr. 16, 1986, (pp. 306-308).

Stephenson F.W., "RC Active Filter Design Handbook", John Wiley & Sons, 1985, (p. 220).

The International Search Report and Written Opinion for Patent Application No. PCT/US2004/041204, filing date: Dec. 10, 2004, (10 pages).

International Preliminary Report on Patentability from corresponding PCT Application Serial No. PCT/US2004/041204 mailed Jan. 20, 2006 (7 pages).

* cited by examiner

COMPLEX FILTER WITH HIGHER ORDER POLE

This application claims the benefit of U.S. Provisional Application Ser. No. 60/529,027, filed Dec. 12, 2003, the entire content of which is incorporated herein by reference.

TECHNICAL FIELD

The invention relates to complex filters, and more particularly, to complex filters with higher order poles.

BACKGROUND

Complex filters may be useful in a number of applications, such as RF devices. For example, a receiver may use one or more complex filters to reduce noise or filter out adjacent channels. In addition, complex filters may be used to accept a complex signal and separate the real part of the signal from the imaginary part of the signal.

Circuits that act as complex filters may generate complex poles. A complex pole may be useful in circuits that filter quadrature signals, for example, to provide an asymmetric response about DC. Circuits with complex poles may generate quadrature signals from a single signal and perform amplitude/phase filtering of the quadrature signals. The quadrature signals may be generated by quadrature downconversion or in preparation for quadrature upconversion.

Several techniques exist for generating a single complex pole. For example, cross coupling may be used between pairs of real poles. Another technique involves converting a pair of ladder-derived real filters into a frequency-shifted complex filter by using cross coupling between the real filters. In both techniques described, frequency-independent cross coupling and single real poles are used.

SUMMARY

In general, the invention is directed to a technique for creating a complex electrical filter, which has an asymmetric response about DC. The complex filter may be especially useful in a wireless communication system. The technique involves the use of pairs of second-order filters, such as biquadratic (biquad) filters, with feedback and cross coupling. The cross coupling may be frequency-dependent cross coupling or frequency-independent cross coupling. Frequency-independent cross coupling may involve coupling to an internal node of the biquad filter. The complex filter can be used to readily provide higher order poles.

A complex filter in accordance with the invention may provide one or more advantages. For example, the invention allows biquad-derived real filters to be made into complex filters in a straightforward manner. The resulting complex filter can achieve higher order poles while offering reduced circuit complexity. In addition, the shape of a filtered signal can be maintained over a range of operating conditions because pairs of poles in the complex filter move together with changes in operating conditions. Accordingly, the filter may offer reduced sensitivity. In some embodiments, a second-order complex filter may be realized without a differentiator, providing reductions in the chip area consumed by the filter. Additionally, elimination of the differentiator may result in reduced noise.

In one embodiment, the invention provides a complex filter comprising an input port to receive a complex input signal, a first output port that produces a real output component, a second output port that produces an imaginary output component, a pair of second order filters, wherein each of the second order filters receives a sum of at least a portion of the input signal, and an amplified portion of one of the first and second output components.

In another embodiment, the invention provides a method comprising receiving a complex input signal, generating a real output component of the complex input signal, generating an imaginary output component of the complex input signal, passing a sum of at least a portion of the complex input signal and an amplified portion of one of the first and second output components through each of a pair of second order filters to produce the complex input signal and the complex output signal.

In a further embodiment, the invention provides a wireless receiver comprising an antenna to receive a wireless input signal, an amplifier to amplify the wireless input signal, and a complex filter having an input port to receive the wireless input signal, a first output port that produces a real output component of the wireless signal, a second output port that produces an imaginary output component of the wireless signal, and a pair of second order filters, wherein each of the second order filters receives a sum of at least a portion of the input signal, and an amplified portion of one of the first and second output components.

In another embodiment, the invention provides a complex filter comprising a first biquad filter, a second biquad filter, a first feedback loop between an output and input of the first biquad filter, a second feedback loop between an output and input of the second biquad filter, a cross-coupling between the first biquad filter and the second biquad filter.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
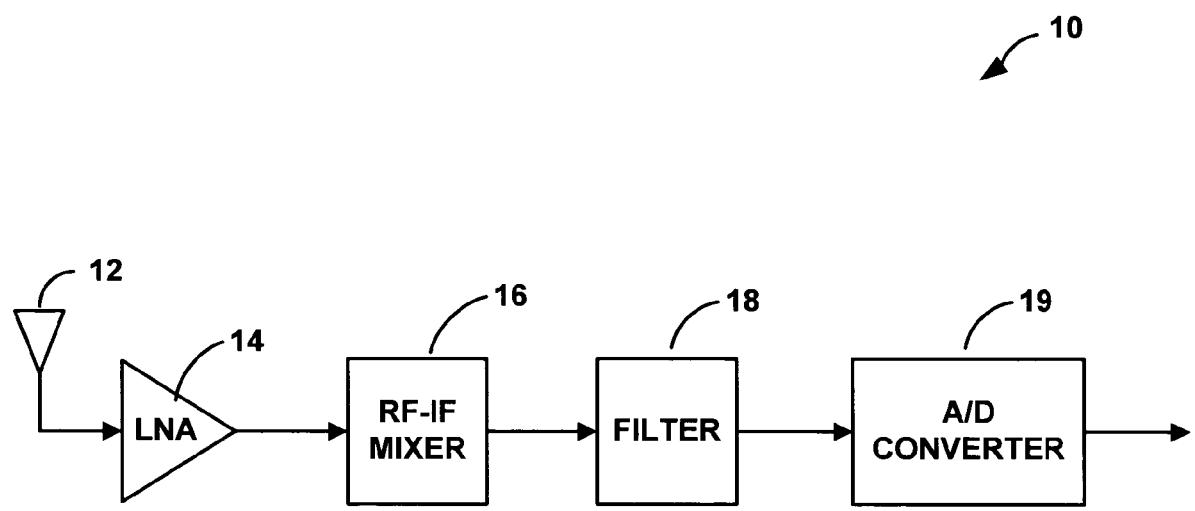
FIG. 1 is a block diagram illustrating an exemplary communication system that includes a filter for filtering complex signals.

FIG. 1 is a block diagram illustrating an exemplary system 10 that includes a filter 18 for filtering complex signals. Complex filters are used in a variety of telecommunications applications, such as wireless network access points, communication chips, receivers, and transmitters. System 10, which may be part of a receiver system, includes an antenna 12, a low noise amplifier (LNA) 14, a Radio Frequency-to-Intermediate Frequency (RF-to-IF) mixer 16, a filter 18, and an analog-to-digital converter 19.

System 10 receives an RF signal via antenna 12. Antenna 12 passes the signal to the LNA 14, which amplifies the signal. Mixer 16 processes the amplified RF signal by downconverting the signal from a high RF frequency, such as 5.2 GHz, to an intermediate frequency, such as 10 MHz. In one embodiment, mixer 16 comprises a down mixer and a quadrature mixer, which are cascaded in two stages. In another embodiment, mixer 16 may use complex mixing to separate an imaginary image from the signal.

In one example, mixer 16 may be configured to process signals transmitted within a wireless network conforming to the IEEE 802.11a, 802.11b, or 802.11g standards. Mixer 16 generates baseband signals for in-phase and quadrature phase components of the RF signal. Mixer 16 passes the amplified signal to filter 18, which filters out adjacent channels, alternate adjacent channels, and noise. For example, filter 18 may filter out negative frequencies, thereby removing negative frequency images from the signal. In one embodiment, filter 18 further includes a block that limits the dynamic range of system 10.

Filter 18 may be configured to relay the filtered signal to another component, such as an analog-to-digital (A/D) converter 19. A/D converter 19 converts the analog signal to a digital signal for additional processing, e.g., with a demodulation block. The digital signal may be further amplified and processed based on the needs of the system 10.

In some applications, system 10 may include pairs of second-order filters with feedback and cross coupling for implementing pairs of complex poles. The cross coupling may be frequency-dependent cross coupling or frequency-independent cross coupling. The second-order filters may simultaneously perform both lowpass and highpass filtering of an input signal to selectively pass signals in particular frequency ranges.

Figure 2:
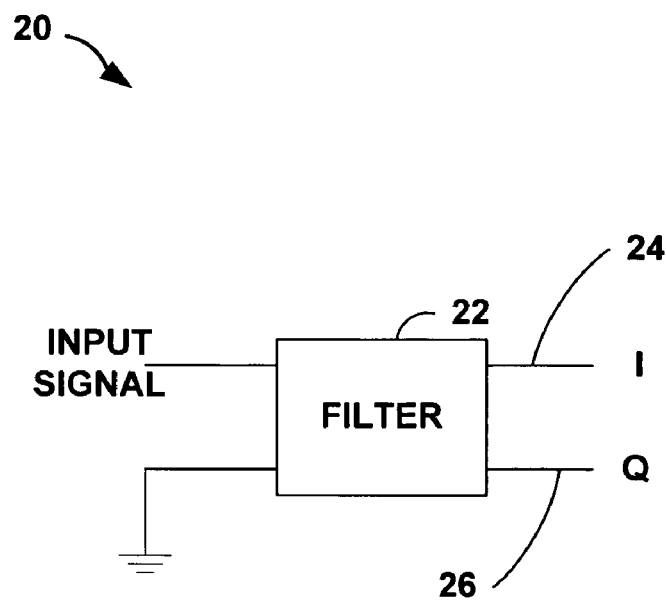
FIG. 2 is a block diagram illustrating a basic complex filter accepting a single input signal.

FIG. 2 is a block diagram illustrating a basic complex filter circuit 20 accepting a single input signal, for purposes of example. Complex filters may accept a complex input signal and separate the real part of the signal from the imaginary part of the signal. As shown in FIG. 2, complex filter 22 separates an input signal into an 'I' output component 24 and a 'Q' output component 26. The 'I' output component 24 is the real component of the input signal and the 'Q' output component 26 is the imaginary component of the input signal. In one embodiment, the 'I' component 24 leads the 'Q' component 26 by approximately 90 degrees. In practice, filter circuit 20 may be modified in a variety of manners. For example, filter 22 may accept more than one input.

Figure 3:
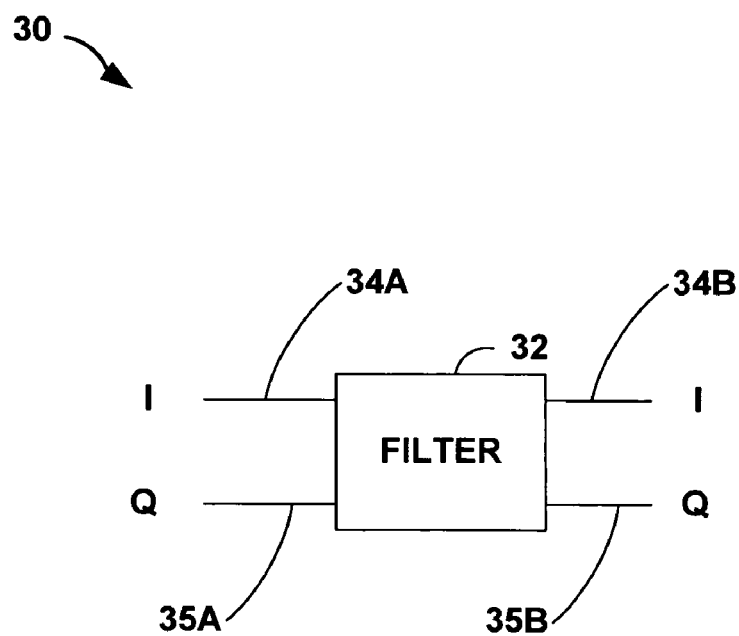
FIG. 3 is a block diagram illustrating a basic complex filter accepting two input signals.

FIG. 3 is a block diagram illustrating a basic complex filter circuit 30 accepting two input signals. Rather than inputting a single input signal into filter 32, both 'I' and 'Q' components of an input signal are separately applied to filter 32. Two or more filters 22 (FIG. 2) may be used together to make a higher order complex filter circuit 32. For example, two complex filters may be used to make a second order complex filter, such as a biquadratic (biquad) filter. Second order filters, which include Tow-Thomas biquad filters, may be used as described below for implementing pairs of complex poles.

Figure 4:
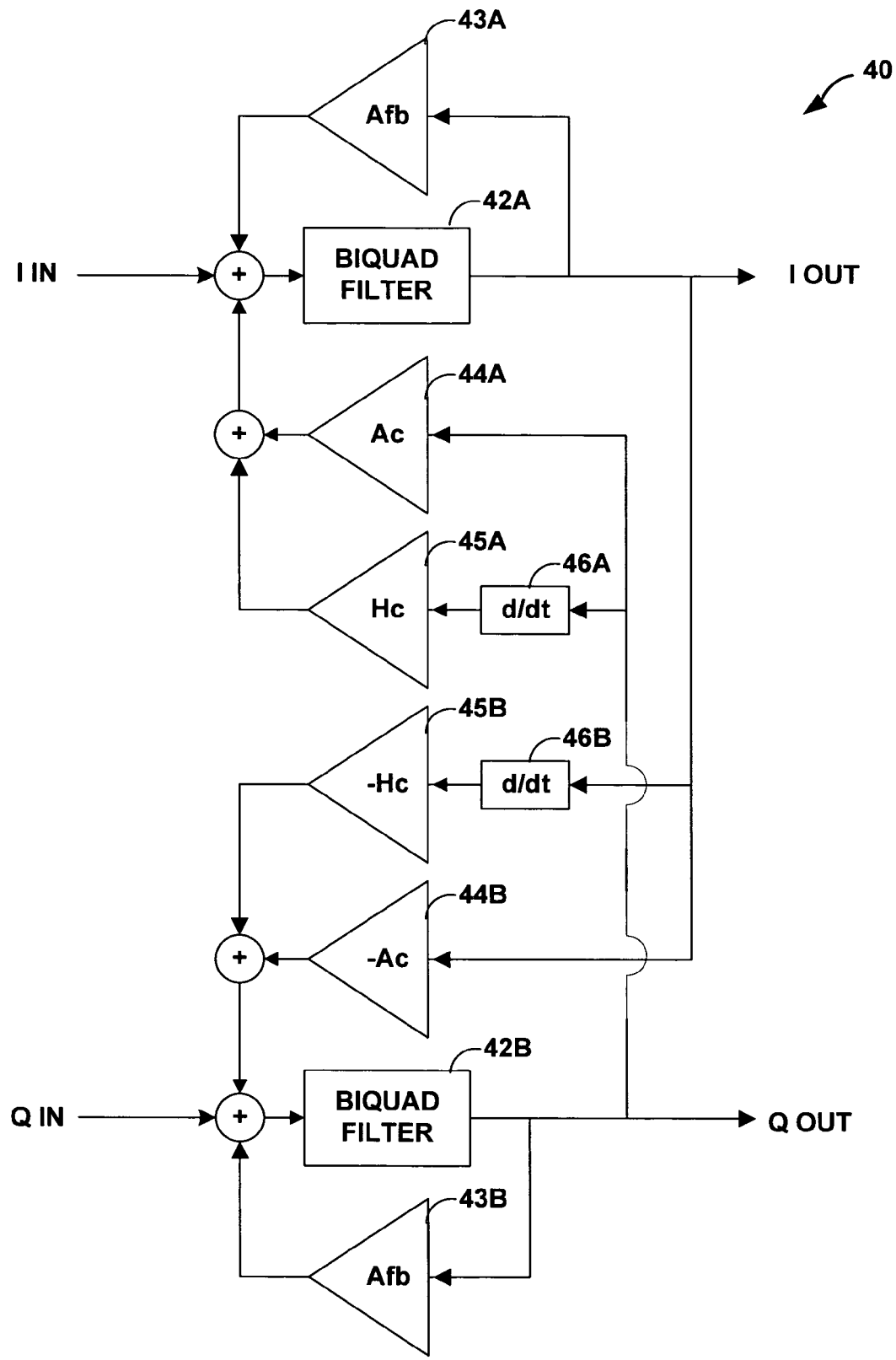
FIG. 4 is a diagram illustrating an implementation of a complex filter circuit with two second-order filters.

FIG. 4 is a circuit diagram illustrating implementation of a complex filter circuit 40 with two second-order filters. In particular, the two second-order filters may be all-pole biquad filters. The complex filter 40 may include two channels, an 'I' channel and a 'Q' channel. The 'I' channel corresponds to a real portion of an input signal, while the 'Q' channel corresponds to the imaginary portion of an input signal. As shown in FIG. 4, complex filter circuit includes biquad filters 42A, 42B, differentiators (d/dt) 46A, 46B, and amplifiers Afb 43A, Afb 43B, Ac 44A, -Ac 44B, Hc 45A, -Hc 45B.

An all-pole biquad filter has the following transfer function:

$$\frac{y}{x} = \frac{w_0^2}{s^2 + s\frac{w_0}{Q} + w_0^2} = \frac{1}{\frac{s^2}{w_0^2} + \frac{s}{w_0^2} + 1} = \frac{1}{1 + j\frac{w}{w_0 Q} - \frac{w^2}{w_0^2}}$$

where y is the output, x is the input, $w_o$ is the cut-off frequency of the biquad filter, w is the frequency, and Q is the 'Q' factor of the biquad filter. However, a complex all-pole biquad filter has the transfer function:

$$\frac{y}{x} = \frac{1}{1 + j\frac{(w - w_1)}{w_0 Q} - \frac{(w - w_1)^2}{w_0^2}} = \frac{1}{1 + j\frac{w}{w_0 Q} - j\frac{w_1}{w_0 Q} - \frac{w^2}{w_0^2} + 2\frac{w_1 w}{w_0^2} - \frac{w_1^2}{w_0^2}}$$

The value $w_1$ is the frequency shift.

Feedback and cross-coupling are used in order for complex filter circuit 40 to produce the complex all-pole biquad filter transfer function. The gains from cross-coupling include a frequency independent term, and a term proportional to s, which is shown by (d/dt) in FIG. 4. As discussed in more detail below, the frequency dependent term may instead be implemented by using a frequency independent cross gain into an auxiliary input of a Tow-Thomas biquad.

A feedback circuit of the 'I' channel may include an amplifier Afb 43A, which connects the output of biquad filter 42A to the input of biquad filter 42A. The output of Afb 43A is added to the output of amplifier Ac 44A and amplifier Hc 45A. The sum of Afb 43A, Ac 44A, Hc 45A and an 'I' component of the input signal is inputted into biquad filter 42A. Maintaining consistency with the complex all-pole biquad filter transfer function, the values of amplifiers Afb, Ac, and Hc are as follows:

$$Afb = \frac{w_1^2}{w_0^2},$$

which is a frequency-independent feedback term with no j;

$$Ac = \frac{w_1}{w_0 Q},$$

which is a frequency-independent, feedback term from the 'Q' channel with no j; and $$Hc = \frac{2w_1}{w_0^2},$$

which is a frequency-dependent feedback term from the 'Q' channel with j.

The value of the output y of biquad filter 42A may be expressed with respect to the input x' of the biquad filter.

$$y = x' \frac{1}{1 + j\frac{w}{w_0 Q} - \frac{w^2}{w_0^2}}, \text{ where}$$

$$x' = x + x'' = y\left(1 + \frac{jw}{w_0 Q} - \frac{jw_1}{w_0 Q} - \frac{w^2}{w_0^2} + 2\frac{w_1 w}{w_0^2} - \frac{w_1^2}{w_0^2}\right) + x'',$$

$$= y\left(1 + \frac{jw}{w_0 Q} - \frac{w^2}{w_0^2}\right), \text{ and}$$

$$x'' = y\left(\frac{w_1^2}{w_0^2} + \frac{jw_1}{w_0 Q} - 2\frac{w_1 w}{w_0^2}\right),$$

where x" is the sum of Afb, Ac, and Hc.

For ease of explanation, techniques for calculating only the values of 'I' channel components are described. 'Q' channel components are calculated using similar techniques. In particular, the same principles used for the 'I' channel may be applied to the 'Q' channel, with jX as the input and jY as the output. Accordingly, FIGS. 5-7, 9 and 10 generally illustrate one-half of a complex filter for ease of illustration. The other half may be formed by another version of the illustrated filter to form the complex filter.

The complex poles of complex filter circuit 40 are at:

$$-\frac{w_0}{2Q} \pm w_0 \sqrt{1 - \frac{1}{4Q^2}} * j + w_1 j$$

The pair of complex poles corresponding to complex filter circuit 40 may move together as operating conditions change. In other words, the shape of a filtered signal may be maintained because pairs of real and imaginary poles move together, tracking one another.

Figure 5:
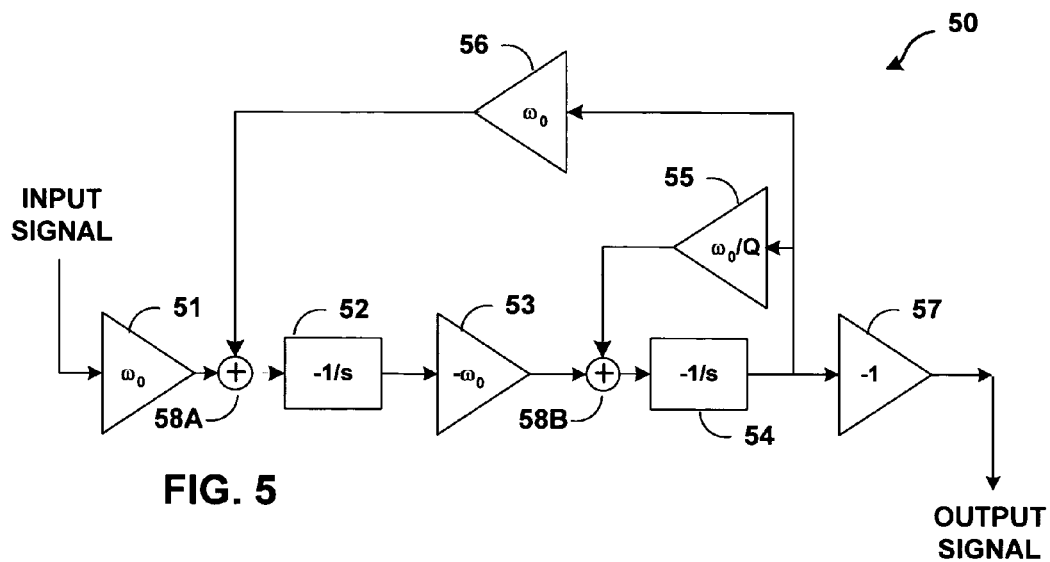
FIG. 5 is a diagram illustrating an exemplary second-order filter for use as part of a complex filter circuit.

FIG. 5 is a diagram illustrating an exemplary second-order filter 50 that can be part of a complex filter. In particular, filter 50 may be a Tow-Thomas biquad filter, which can be used in the complex filter circuit 40 described above. Filter 50 includes inverting integrators 52, 54, and an inverter 57. In addition, filter 50 includes gains 51, 53, 55, and 56, and summations 58A and 58B. Taken together, these components form an exemplary implementation of the unity-gain all-pole biquad transfer function. The transfer function of filter 50 is:

$$\frac{V_{OUT}}{V_{IN}} = \frac{w_0^2}{s^2 + \frac{w_0}{Q}s + w_0^2}$$

Figure 6:
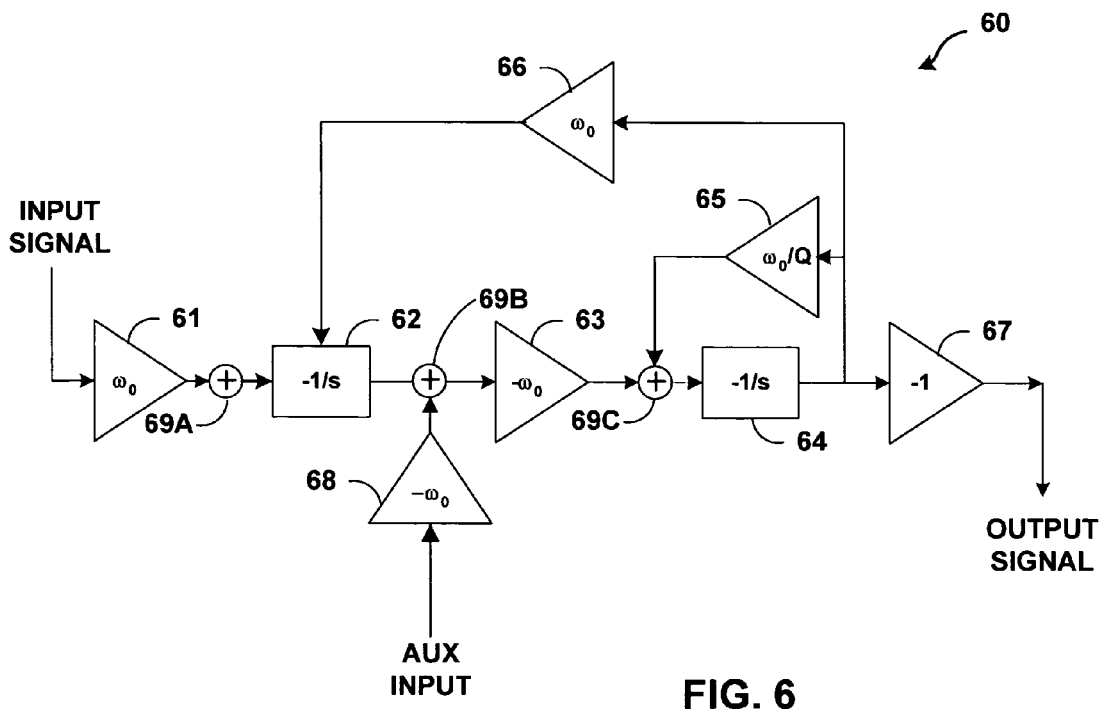
FIG. 6 is a diagram illustrating an alternative second-order filter with an auxiliary input.

FIG. 6 is a diagram illustrating an alternative second-order filter 60 with an auxiliary input. The filter 60 may be a Tow-Thomas biquad filter, which may be used in the complex filter circuit 40 described above. Filter 60 is a modified version of filter 50. In particular, filter 60 includes an auxiliary input that is added to filter 50. Filter 60 includes inverting integrators 62, 64, and an inverter 67. In addition, filter 60 includes gains 61, 63, 65, 66, and 68, and summations 69A, 69B, and 69C. Together, these components form an exemplary implementation of the unity-gain all-pole biquad transfer function from the main input $V_{IN}$ to the output $V_{OUT}$, as well as an implementation of a differentiated version of the unity-gain all-pole biquad transfer function from the auxiliary input $V_{AUX}$ to the output $V_{OUT}$. The transfer function of filter 60 from auxiliary input $V_{AUX}$ to output $V_{OUT}$ is:

$$\frac{V_{OUT}}{V_{AUX}} = \frac{sw_0^2}{s^2 + \frac{w_0}{Q}s + w_0^2} = s\frac{V_{OUT}}{V_{IN}}$$

As seen in the transfer function of filter 60, bringing a signal though the auxiliary input is equivalent to bringing s* the signal into the primary input (i.e., s multiplied by the signal into the primary input). This is equivalent to bringing the signal through a differentiator into the primary input.

Figure 7:
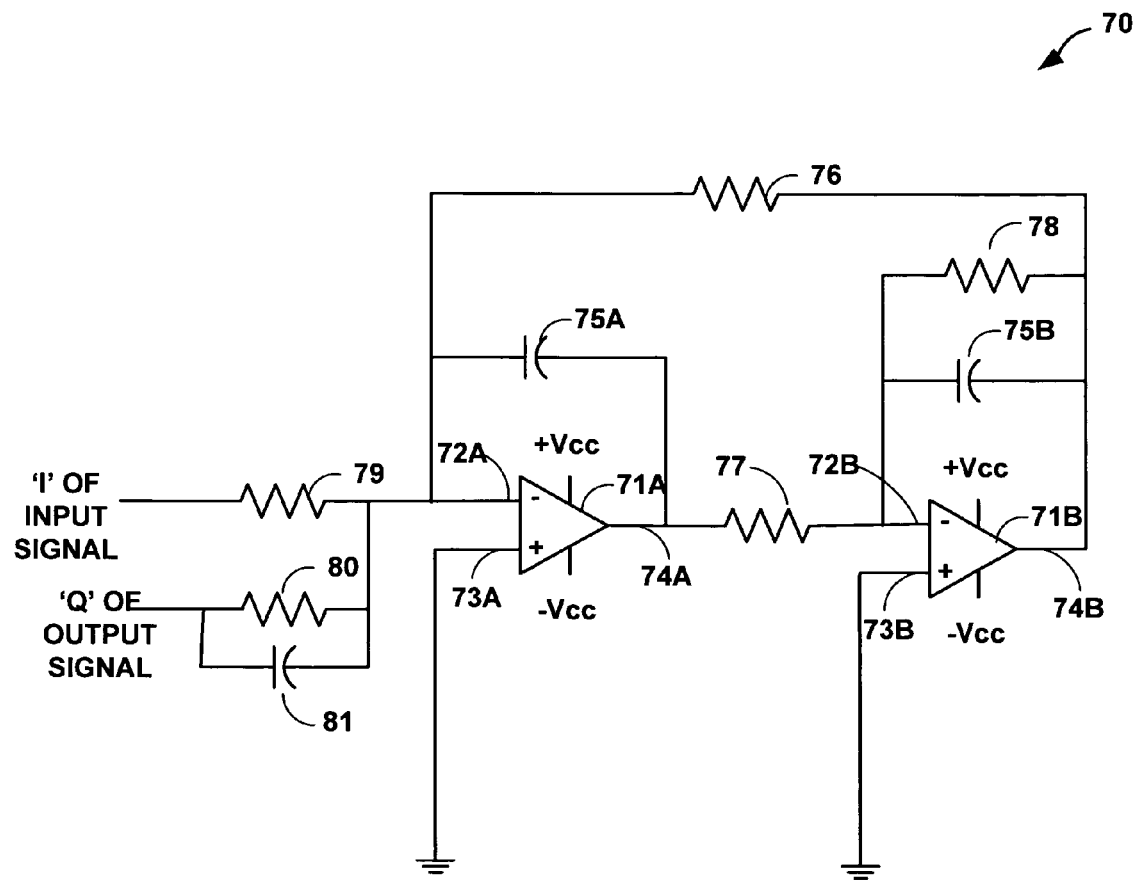
FIG. 7 is a schematic diagram illustrating the exemplary second-order filter of FIG. 6, with no auxiliary input.

FIG. 7 is a schematic diagram illustrating the exemplary second-order filter 70 (shown conceptually as filter 50 in FIG. 5), which has no auxiliary input. Filter 70 may be a Tow-Thomas filter and fully-differential to allow inversion by cross-coupling. As shown in FIG. 7, the second-order filter 70 may include operational amplifiers 71A, 71B, resistor 76, resistor 77, resistor 78, resistor 79, resistor 80, and capacitor 81. More particularly, operational amplifier 71A comprises input ports 72A, 73A, output port 74A, and a capacitor 75A connecting output port 74A to input port 72A. Likewise, operational amplifier 72B comprises input ports 72B, 73B, output port 74B, a capacitor 75B connecting output port 74B to input port 72B, and resistor 78 also connecting output port 74B to input port 72B. Resistor 77 connects the output 74A of operational amplifier 71A to the input 72B of operational amplifier 71B. In addition, resistor 76 feeds the output 74B of operational amplifier 71B to the input 72A of operational amplifier 71A.

The 'I' component of the input signal passes through resistor 79 on the way to input 72A of operational amplifier 71A. Likewise, the 'Q' component of the output signal passes through resistor 80 in parallel with capacitor 81 on the way to input 72A of operational amplifier 71A. Resistor 80 and capacitor 81 may together form a differentiator. Some exemplary relationships of circuit elements in filter 70 are as follows:

$$R_{79} = \frac{1}{w_o C_{75A}}$$

$$R_{76} = \frac{w_o}{(-w_1^2 + w_o^2) C_{75A}}$$

$$R_{77} = \frac{-1}{w_o C_{75B}}$$

$$R_{78} = \frac{Q}{w_o C_{78B}}$$

$$R_{80} = \frac{Q}{w_1 C_{75A}}$$

$$C_{81} = 2C_{75A} \frac{w_1}{w_0}$$

In the above expressions, the subscripted number refers to the reference number of the corresponding component illustrated in FIG. 7.

Figure 8:
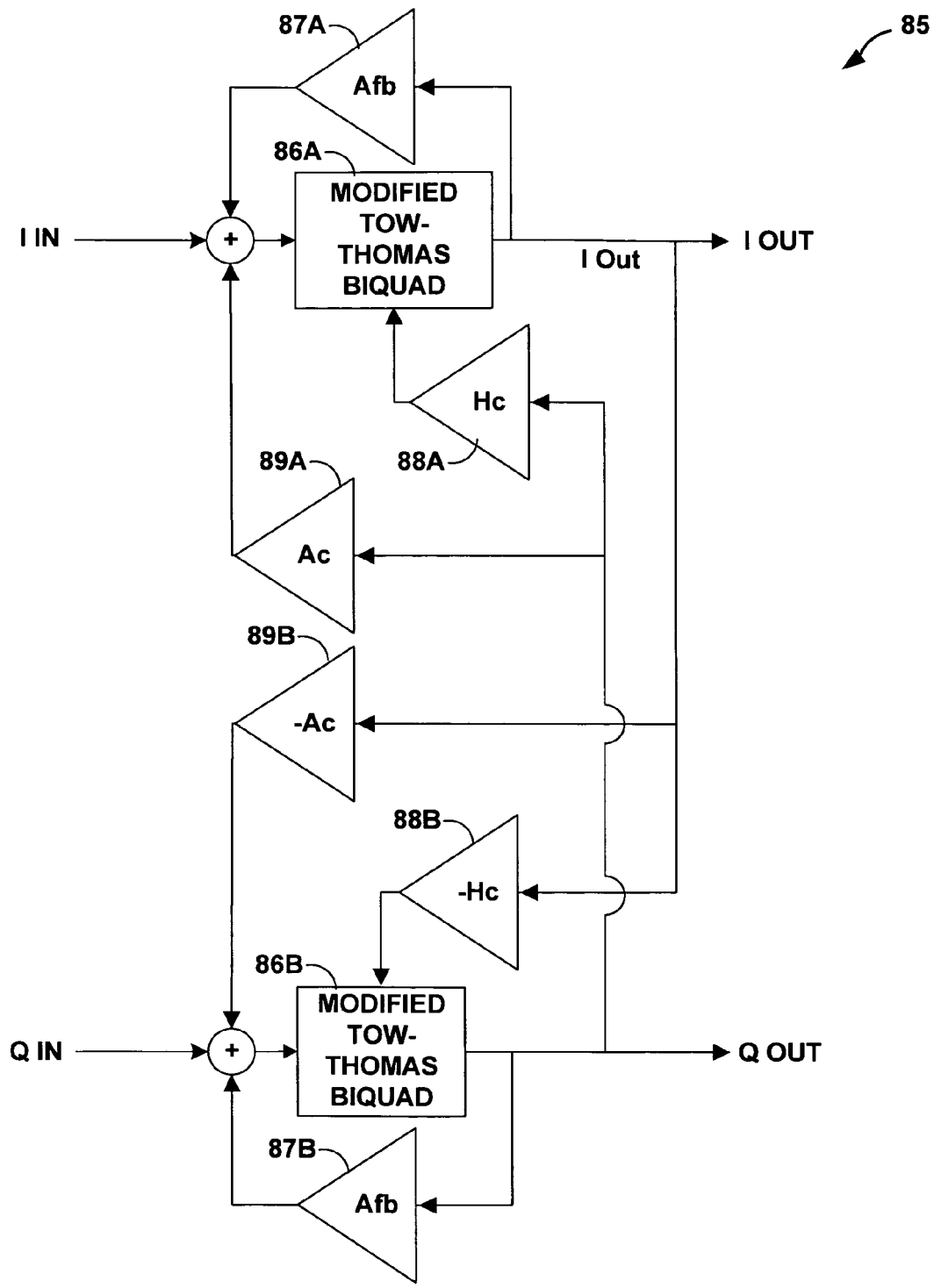
FIG. 8 is a signal flow diagram illustrating an implementation of a complex filter circuit that includes two second-order filters.

FIG. 8 is a diagram illustrating an implementation of another complex filter circuit 85. As shown in FIG. 8, complex filter circuit 85 includes two second-order filters. In particular, the two second-order filters may be modified Tow-Thomas biquad filters. Each biquad filter receives an auxiliary input along with a primary input. An 'I' channel corresponds to a real portion of an input signal, while a 'Q' channel corresponds to the imaginary portion of an input signal. As shown in FIG. 4, complex filter circuit includes biquad filters 86A, 86B, and amplifiers Afb 87A, Afb 87B, Ac 89A, -Ac 89B, Hc 88A, -Hc 88B.

The function of complex filter 85 is substantially the same as complex filter 40 shown in FIG. 4. However, there are some features in complex filter 85 that distinguish it from complex filter 40. For example, complex filter 85 allows a simple gain to be used rather than a differentiator. In addition, the auxiliary inputs into biquad filters 86A, 86B cause the gain of complex filter circuit 85 to be frequency independent.

Figure 9:
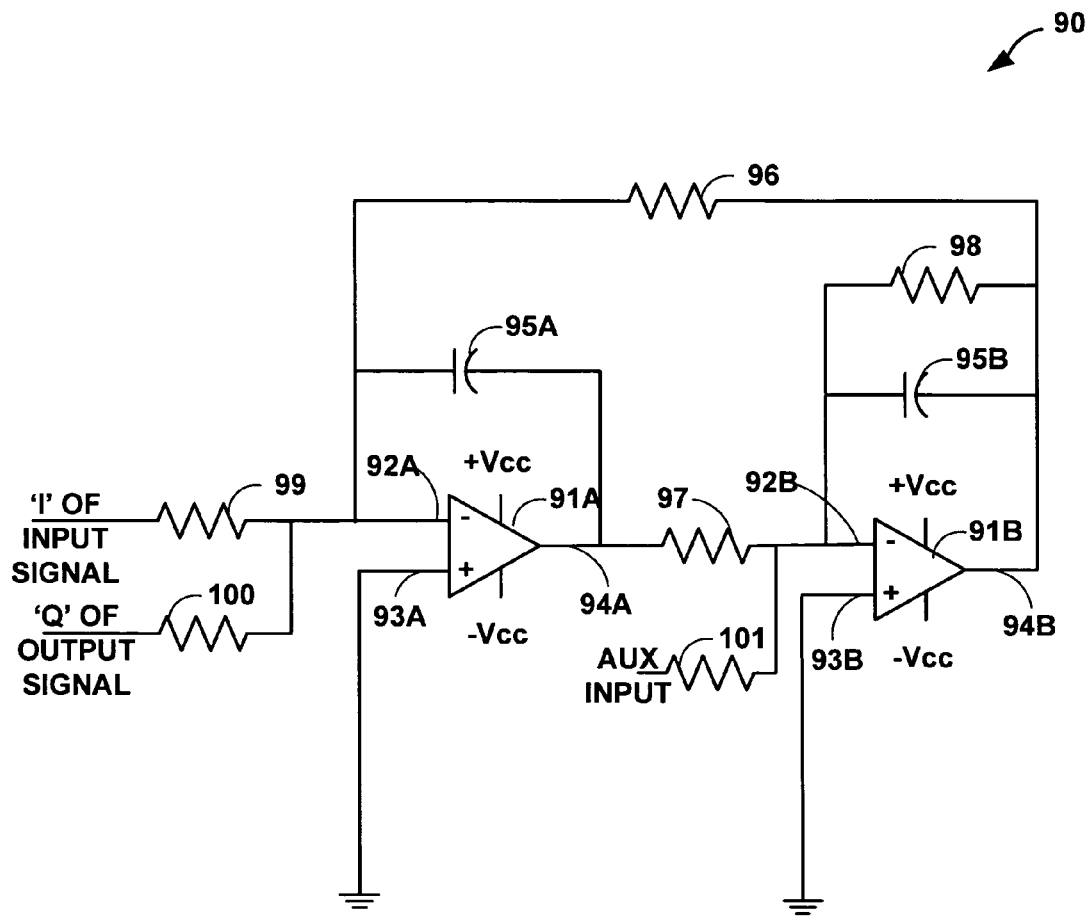
FIG. 9 is a schematic diagram illustrating an alternative second-order filter, which has an auxiliary input.

FIG. 9 is a schematic diagram illustrating an alternative second-order filter 90 (shown conceptually as filter 60 in FIG. 6), which has an auxiliary input. Filter 90 may be a modified Tow-Thomas filter. As shown in FIG. 9, the second-order filter 90 may include operational amplifiers 91A, 91B, resistor 96, resistor 97, resistor 98, resistor 99, resistor 100, and resistor 101. More particularly, operational amplifier 91A comprises input ports 92A, 93A, output port 94A, and a capacitor 95A connecting output port 94A to input port 92A. Likewise, operational amplifier 92B comprises input ports 92B, 93B, output port 94B, a capacitor 95B connecting output port 94B to input port 92B, and resistor 98 also connecting output port 94B to input port 92B. Resistor 97 connects the output 94A of operational amplifier 91A the input 92B of operational amplifier 91B. In addition, resistor 96 feeds the output 94B of operational amplifier 91B to the input 92A of operational amplifier 91A.

The 'I' component of the input signal passes through resistor 99 on the way to input 92A of operational amplifier 91A. Likewise, the 'Q' component of the output signal passes through resistor 100 on the way to input 92A of operational amplifier 91A. Additionally, the auxiliary input signal passes through resistor 101 on the way to input 92B of operational amplifier 91B. Some relationships of circuit elements in complex filter 90 are as follows:

$$R_{99} = \frac{1}{w_o C_{95A}}$$

$$R_{96} = \frac{w_o}{(-w_1^2 + w_o^2) C_{95A}}$$

$$R_{97} = \frac{-1}{w_o C_{95B}}$$

$$R_{98} = \frac{Q}{w_o C_{95B}}$$

$$R_{100} = \frac{Q}{w_1 C_{95A}}$$

$$R_{101} = \frac{w_0}{2 w_1 C_{95B}}$$

In the above expressions, the subscripted number refers to the reference number of the corresponding component illustrated in FIG. 9.

Filter 90 is very similar to filter 70 shown in FIG. 7. However, filter 90 does not use a differentiator. Instead, filter 90 adds an auxiliary input signal that passes through resistor 101. Moreover, filter 90 allows a simple gain to be used in place of the differentiator. Lack of a differentiator in complex filter 90 may reduce the chip area required for the second-order complex filter. Additionally, there may be less noise without the differentiator.

Figure 10:
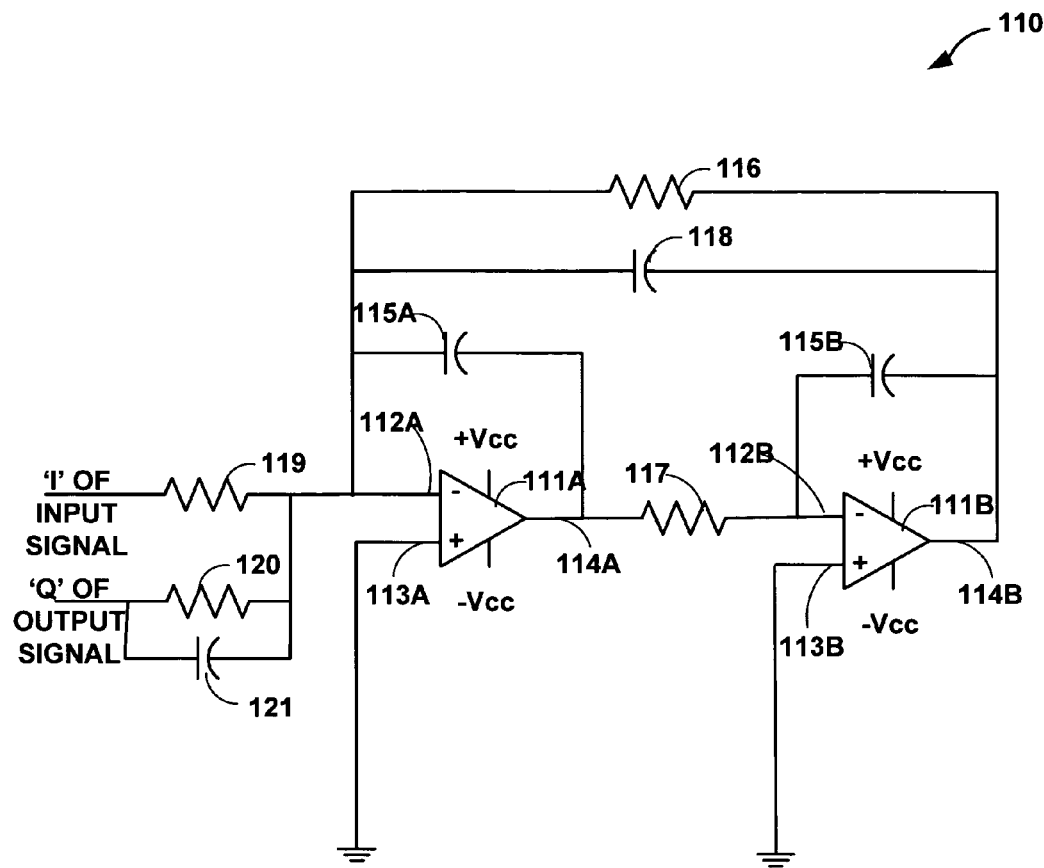
FIG. 10 is a schematic diagram illustrating an alternative second-order filter that can be part of a complex filter circuit.

FIG. 10 is a schematic diagram illustrating an alternative second-order filter 110 that may be part of a complex filter. This complex filter is not specifically a Tow-Thomas filter, but rather represents a general filter. In addition, filter 110 accepts no auxiliary input. Second-order filter 110 is similar to the filter shown in FIG. 7, except that feedback resistor 78 has been replaced by capacitor 118. Feedback resistor 78 connected output port 74B to input port 72B, whereas capacitor 118 connects the output 114B of operational amplifier 111B to input 112A of operational amplifier 111A. The Q factor of the filter is then set by the ratio of capacitors 115B and 118. In general capacitors can be made to match well, leading to a precise value for the Q factor. The value of resistor 117 can tune all parameters of the filter as long as all capacitors track each other. As shown in FIG. 10, the cross gains include a frequency dependent term.

As shown in FIG. 10, the second-order filter 110 may include operational amplifiers 111A, 111B, resistor 116, resistor 117, resistor 118, resistor 119, resistor 120, and capacitor 121. More particularly, operational amplifier 111A comprises input ports 112A, 113A, output port 114A, and a capacitor 115A connecting output port 114A to input port 112A. Likewise, operational amplifier 112B comprises input ports 112B, 113B, output port 114B, and a capacitor 115B connecting output port 114B to input port 112B. Resistor 117 connects the output 114A of operational amplifier 111A the input 112B of operational amplifier 111B. In addition, resistor 116 and capacitor 118 feed the output 114B of operational amplifier 111B to the input 112A of operational amplifier 111A.

The 'I' component of the input signal passes through resistor 119 on the way to input 112A of operational amplifier 111A. Likewise, the 'Q' component of the output signal passes through resistor 120 in parallel with capacitor 121 on the way to input 112A of operational amplifier 111A. Resistor 120 and capacitor 121 may together form a differentiator. Some relationships of circuit elements in complex filter 110 are as follows:

$$R_{119} = \frac{1}{w_o C_{115A}}$$

$$R_{116} = \frac{w_0}{(-w_1^2 + w_o^2) C_{115A}}$$

$$R_{117} = \frac{-1}{w_o C_{115B}}$$

$$R_{120} = \frac{Q}{w_1 C_{115A}}$$

$$C_{121} = 2 C_{115A} \frac{w_1}{w_0}$$

$$C_{118} = \frac{C_{115A}}{Q}$$

In the above expressions, the subscripted number refers to the reference number of the corresponding component illustrated in FIG. 10.

Figure 11:
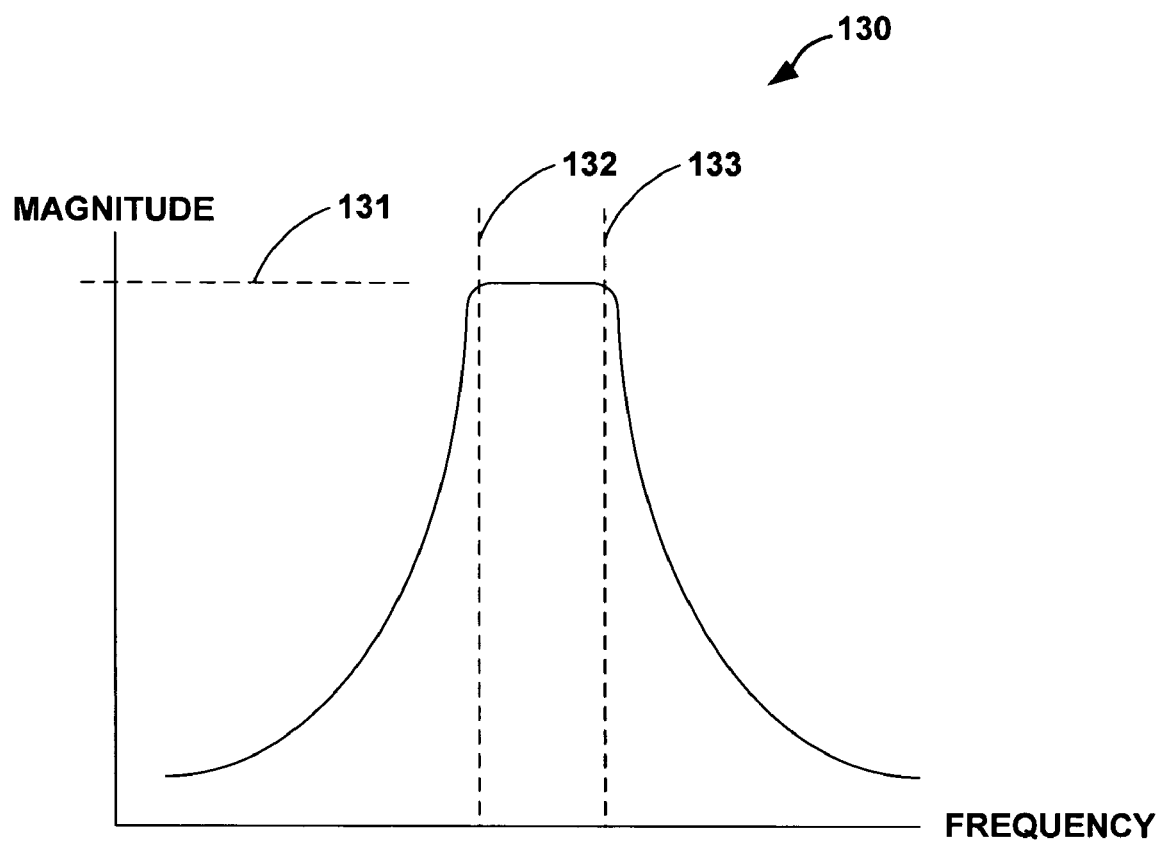
FIG. 11 is a graph illustrating a frequency response of an exemplary second-order complex filter.

FIG. 11 is a graph illustrating a frequency response 130 of an exemplary second-order complex filter. The second-order complex filter may behave as a bandpass filter. In particular, the filter may filter out any unwanted frequencies. In one example, the filter allows only signals within a band of real frequencies to pass. The frequency response 130 shows a band of frequencies that are allowed to pass through a complex filter. As shown, the magnitude 131 of the frequency response 130 is greatest between frequency 132 and frequency 133. In one embodiment, the maximum magnitude 131 of the frequency response may be approximately zero decibels. Depending on the characteristic of the bandpass filter, a number of frequency ranges may pass through the filter. For example, frequency 132 may be approximately zero MHz, and frequency 133 may be approximately 20 MHz.

The frequency response 130 of the second-order complex filter may be substantially the same regardless of how the filter is implemented. For example, a Tow-Thomas implementation using a differentiator, a Tow-Thomas implementation using the auxiliary input, a high-Q biquad using a differentiator, a high-Q biquad using an auxiliary input, a different type of biquad using a differentiator, or a different type of biquad whose first stage is an integrator, all give the same frequency response. By design, any of the filters described above may conform to the principles of a bandpass filter.

Various embodiments of the invention have been described. These and other embodiments are within the scope of the following claims.

The invention claimed is:

1. A complex analog filter comprising:
   a first second order analog filter having a first input coupled to receive a real input component of a complex input signal;
   a second second order analog filter having a second input coupled to receive an imaginary input component of the complex input signal;
   a first output, coupled to the first second order analog filter, that produces a real output component;
   a second output, coupled to the second second order analog filter, that produces an imaginary output component,
   wherein the first input is coupled to receive a sum of the real input component and a differentiated portion of the imaginary output component, and
   wherein the second input is coupled to receive a sum of the imaginary input component and a differentiated portion of the real output component.

2. The complex analog filter of claim 1, wherein the complex filter has an asymmetric response about DC.

3. The complex analog filter of claim 1, wherein the real output component leads the imaginary output component by approximately 90 degrees.

4. The complex analog filter of claim 1, further comprising:
   a first amplifier that amplifies the real output component to produce an amplified real output component; and
   a second amplifier that amplifies the imaginary output component to produce an amplified imaginary output component,
   wherein the first input is coupled to receive a sum of the real input component, the differentiated portion of the imaginary output component, and the amplified real output component, and
   wherein the second input is coupled to receive a sum of the imaginary input component, the differentiated portion of the real output component, and the amplified imaginary output component.

5. The complex analog filter of claim 4, further comprising:
   a third amplifier that amplifies the differentiated portion of the imaginary output component to produce an amplified differentiated imaginary output component that is summed with the real input component and the amplified real output component; and
   a fourth amplifier that amplifies the differentiated portion of the real output component to produce an amplified differentiated real output component that is summed with the imaginary input component and the amplified imaginary output component.

6. The complex analog filter of claim 5, wherein the amplified real output component comprises a first amplified real output component, and the amplified imaginary output component comprises a first amplified imaginary output component, the complex analog filter further comprising:
   a fifth amplifier that amplifies the imaginary output component to produce a second amplified imaginary output component; and
   a sixth amplifier that amplifies the real output component to produce a second amplified real output component,
   wherein the first input is coupled to receive a sum of the real input component, the first amplified real output component, the second amplified imaginary output component, and the amplified differentiated imaginary output component and
   wherein the second input is coupled to receive a sum of the imaginary input component, the first amplified imaginary output component, the second amplified real output component, and the amplified differentiated real output component.

7. A method comprising:
   receiving a complex input signal comprising a real input component and an imaginary input component;
   generating a real output component of the complex input signal at an output of a first second order analog filter;
   generating an imaginary output component of the complex input signal at an output of a second second order analog filter;
   applying a sum of the real input component of the complex input signal and a differentiated portion of the imaginary output component to an input of the first second order analog filter; and
   applying a sum of the imaginary input component and a differentiated portion of the real output component and passing the sum to an input of the second second order analog filter.

8. The method of claim 7, wherein the second order filters form a complex filter having an asymmetric response about DC.

9. The method of claim 7, wherein the real output component leads the imaginary output component by approximately 90 degrees.

10. The method of claim 7, further comprising:
    amplifying the real output component via a first amplifier to produce an amplified real output component; and
    amplifying the imaginary output component via a second amplifier to produce an amplified imaginary output component,
    wherein the sum applied to the input of the first second order analog filter includes a sum of the real input component, the differentiated portion of the imaginary output component, and the amplified real output component, and
    wherein the sum applied to the input of the second second order analog filter includes a sum of the imaginary input component, the differentiated portion of the real output component, and the amplified imaginary output component.

11. The method of claim 10, further comprising:
    amplifying the differentiated portion of the imaginary output component via a third amplifier to produce an amplified differentiated imaginary output component that is summed with the real input component and the amplified real output component; and
    amplifying the differentiated portion of the real output component via a fourth amplifier to produce an amplified differentiated real output component that is summed with the imaginary input component and the amplified imaginary output component.

12. The method of claim 11, wherein the amplified real output component comprises a first amplified real output component, and the amplified imaginary output component comprises a first amplified imaginary output component, the method further comprising:

amplifying the real output component via a fifth amplifier to produce a second amplified real output component; and amplifying the imaginary output component via a sixth amplifier to produce a second amplified imaginary output component, wherein the sum applied to the input of the first second order analog filter includes a sum of the real input component, the first amplified real output component, the second amplified imaginary output component, and the amplified differentiated imaginary output component, and wherein the sum applied to the input of the second second order analog filter includes a sum of the imaginary input component, the first amplified imaginary output component, the second amplified real output component, and the amplified differentiated real output component.

13. A complex analog filter comprising:

a first second order analog filter having a first input coupled to receive a real input component of a complex input signal, and a first output that produces a real output component;

a second second order analog filter having a second input coupled to receive an imaginary input component of the complex input signal, and a second output that produces an imaginary output component;

a first frequency-independent cross-coupling that couples the imaginary output component to an auxiliary input of the first second order analog filter; and a second frequency-independent cross-coupling that couples the real output component to an auxiliary input of the second second order analog filter.

14. The complex analog filter of claim 13, further comprising:

a first amplifier that amplifies the imaginary output component that is coupled to the auxiliary input of the first second order analog filter; and a second amplifier that amplifies the real output component that is coupled to the auxiliary input of the second second order analog filter.

15. The complex analog filter of claim 13, further comprising:

a first amplifier that amplifies the real output component to produce a first amplified real output component;

a second amplifier that amplifies the real output component to produce a second amplified real output component;

a third amplifier that amplifies the imaginary output component to produce a first amplified imaginary output component; and a fourth amplifier that amplifies the imaginary output component to produce a second amplified imaginary output component, wherein the input of the first second order analog filter is coupled to receive a sum of the real input component, the first amplified real output component, and the first amplified imaginary output component, and wherein the input of the second second order analog filter is coupled to receive a sum of the imaginary input component, the second amplified imaginary output component, and the second amplified real output component.

16. The complex analog filter of claim 13, wherein the first and second second order filters are modified Tow-Thomas Biquad filters.

17. The complex analog filter of claim 13, wherein the auxiliary input to the first second order analog filter is an internal node to the first second order filter, and wherein the auxiliary input to the second second order analog filter is an internal node to the second second order analog filter.

18. The complex analog filter of claim 13, wherein the complex filter has an asymmetric response about DC.

19. The complex analog filter of claim 13, wherein the real output component leads the imaginary output component by approximately 90 degrees.

20. A method comprising:

receiving a complex input signal comprising a real input component and an imaginary input component;

generating a real output component of the complex input signal at an output of a first second order analog filter;

generating an imaginary output component of the complex input signal at an output of a second second order analog filter;

coupling the imaginary output component to an auxiliary input of the first second order analog filter via a first frequency-independent cross-coupling; and coupling the real output component to an auxiliary input of the second second order analog filter via a second frequency-independent cross-coupling.

21. The method of claim 20, further comprising:

amplifying the imaginary output component that is coupled to the auxiliary input of the first second order analog filter; and amplifying the real output component that is coupled to the auxiliary input of the second second order analog filter.

22. The method of claim 20, further comprising:

amplifying the real output component to produce a first amplified real output component;

amplifying the real output component to produce a second amplified real output component;

amplifying the imaginary output component to produce a first amplified imaginary output component; and amplifying the imaginary output component to produce a second amplified imaginary output component, wherein the input of the first second order analog filter is coupled to receive a sum of the real input component, the first amplified real output component and the first amplified imaginary output component, and wherein the input of the second second order analog filter is coupled to receive a sum of the imaginary input component, the second amplified imaginary output component and the second real output component.

23. The method of claim 20, wherein the first and second second order filters are modified Tow-Thomas Biquad filters.

24. The method of claim 20, wherein the auxiliary input to the first second order analog filter is an internal node to the first second order filter, and wherein the auxiliary input to the second second order analog filter is an internal node to the second second order analog filter.

25. The method of claim 20, wherein the complex filter has an asymmetric response about DC.

26. The method of claim 20, wherein the real output component leads the imaginary output component by approximately 90 degrees.

* * * * *